United States Patent

Balakrishnan

[11] Patent Number: 6,054,376
[45] Date of Patent: Apr. 25, 2000

[54] METHOD OF SEALING A SEMICONDUCTOR SUBSTRATE

[75] Inventor: Sridhar Balakrishnan, Portland, Oreg.

[73] Assignee: Intel Corporation, Santa Clara, Calif.

[21] Appl. No.: 09/001,261

[22] Filed: Dec. 31, 1997

[51] Int. Cl.[7] .................................................. H01L 21/44
[52] U.S. Cl. ....................... 438/612; 438/613; 438/637; 438/640; 438/902
[58] Field of Search .................................. 438/612, 613, 438/637, 640, 902

[56] References Cited

U.S. PATENT DOCUMENTS

| | | | |
|---|---|---|---|
| 5,347,100 | 9/1994 | Fukuda et al. | 219/121.43 |
| 5,444,023 | 8/1995 | Homma | 437/195 |
| 5,686,356 | 11/1997 | Jain et al. | 437/195 |
| 5,854,131 | 12/1998 | Dawson et al. | 438/666 |

Primary Examiner—John F. Niebling
Assistant Examiner—David A. Zarneke
Attorney, Agent, or Firm—Blakely, Sokoloff, Taylor & Zafman LLP

[57] ABSTRACT

A method of sealing a substrate, comprising the steps of depositing a first amount of a first material, having a first dielectric constant, on the substrate to cover a bond pad and a metal line on the substrate and fill a gap between the metal line and the bond pad. The first amount of material forming an inclined surface extending from an edge of the bond pad over the bond pad, depositing a second amount of the first material next to the inclined surface to cause a foot of the inclined surface to move along the inclined surface, etching the first material to cause the foot of the inclined surface to drop onto the bond pad, thereby cleaning a region of the bond pad adjacent the foot of the inclined surface, forming a layer on the first material and sealing on the cleared region of the bond pad, the layer being of a second material which is resistant to moisture and which has a second dielectric constant which is greater than the first dielectric constant, and etching the second layer and the first material to clear an area of the bond pad within the sealing region.

30 Claims, 3 Drawing Sheets

METHOD OF SEALING A SEMICONDUCTOR SUBSTRATE

BACKGROUND OF THE INVENTION

1. Field of the Invention

The present invention relates generally to semiconductor processing and more specifically to a method of sealing a semiconductor substrate and to a semiconductor chip resulting from such a method.

2. Discussion of Related Art

The manufacture of a semiconductor chip involves the formation of metal members on a substrate. These members usually include bond pads, metal lines and a guard ring surrounding the bond pads and the metal lines. The substrate and the metal lines are sealed from the ingress of moisture with an undulating sealing layer which rises over the members and falls into gaps between the members. Holes are etched into the sealing layer to expose areas on the bond pads where metal leads are connected to for electrically connecting the chip to another device.

The members oppose one another, causing stray capacitance to build up between the members which is estimated according to the equation:

$$C = \frac{K \epsilon_0 A}{d}$$

where K is the dielectric constant of the material between the members, $\epsilon$ is the permittivity of free space, A is the exposed area between the members area of a plate, and d is the distance between the members.

As device dimensions decrease and the members are becoming closer to one another, the distance d in the above equation decreases, resulting in a higher stray capacitance. The material of the sealing layer usually has a dielectric constant K which is fairly high, typically above 7.0, thus increasing stray capacitance and enhancing the problem of delay in reaction time of the circuit. A high stray capacitance is undesirable because it causes resistance-capacitance (RC) delay in the reaction time of an underlying circuit.

A method is thus required wherein a semiconductor chip can be manufactured with a material in the gaps which has a low dielectric constant K while maintaining a good seal against the ingress of moisture.

SUMMARY OF THE INVENTION

The invention provides a method of sealing a substrate. A first layer is formed over first and second metal lines on the substrate and within a gap between the metal lines. The first layer is of a first material with a first dielectric constant. Some of the first material is then removed to clear a region on each of the metal lines. A second layer is then formed on the first layer and the cleared regions on the metal lines, thus sealing on the metal lines. The second material is resistant to moisture and has a second dielectric constant which is greater than the first dielectric constant.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION OF THE PRESENT INVENTION

A semiconductor chip and a method of sealing a semiconductor substrate are described. In the following description, for purposes of explanation, numerous specific details are set forth in order to provide a thorough understanding of the present invention. It will be evident, however, to one skilled in the art that the present invention may be practiced without these specific details. In other instances well known semiconductor manufacturing methods and equipment have not been described in detail in order to not obscure the present invention.

The present invention has bearance on a semiconductor chip having a substrate with electrically conductive members formed thereon and gaps between the members, and provides a method of sealing such a semiconductor chip against the ingress of moisture in such a way that a sufficient amount of low dielectric constant material remains in the gaps after the chip has been sealed.

In one embodiment, the present inventive method comprises the following steps. A first layer with a relatively low dielectric constant is deposited onto the semiconductor chip so as to cover the electrically conductive members and fill the gaps between the metal lines. Some of the first material is then etched back to clear a region on each of the electrically conductive members. A second layer which is resistant to moisture is then formed on the first layer and the cleared regions on the metal lines, thus sealing on the metal lines. The second layer thus seals on the electrically conductive members while trapping the low dielectric constant first material within the gaps in such a manner that the first material is sealed off against the ingress of moisture. The deposition and etch back characteristics are such that a sufficient amount of the first material remains in the gaps after etch back, while clearing a sufficiently large region on each of the electrically conductive members to provide a proper seal.

FIGS. 1 to 8 of the accompanying drawings illustrate respective steps of forming a semiconductor chip in accordance with the present invention.

The manufacture of semiconductor chips involves the formation of various semiconductor electrical components on a silicon substrate. The electrical components are then electrically connected to one another by means of metal interconnects to form an integrated circuit. The interconnects are formed by repeatedly forming metal and insulative layers until a last layer of the metal members is formed. The metal members of the last layer usually includes another layer of the metal interconnects, called metal lines, and also a number of terminals, called bond pads, which allow for the integrated circuit to be electrically connected to a host device, and usually also a metal ring, called a guard ring, which surrounds the metal lines and the bond pads so as to protect the metal lines and the bond pad against damage.

Figure 1:
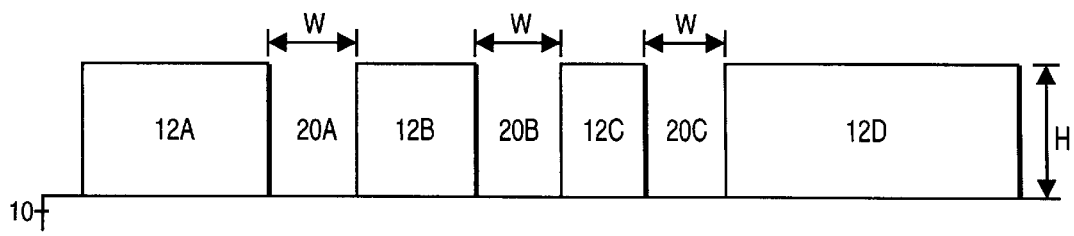
FIG. 1 is an illustration of a cross sectional view of a portion of a semiconductor substrate.

FIG. 1 shows, by way of illustration, a portion of a semiconductor substrate 10 with a number of metal members of the substrate including a guard ring 12a, a first metal line 12b, a second metal line 12c, and a bond pad 12d. The first metal line 12b is spaced from the guard ring 12a by a first gap 20a, the first and second metal lines 12b and 12c are spaced from one another by a second gap 20b, and the bond pad 12d is spaced from the second metal line 12c by a third gap 20c. The members 12 stand above the substrate by a height H which is typically about 1.7 $\mu$m and are successively spaced from one another by a width W which is typically about 0.35 $\mu$m. The aspect ratio, H/W, of some of the smaller gaps may be 2 or more.

Figure 2:
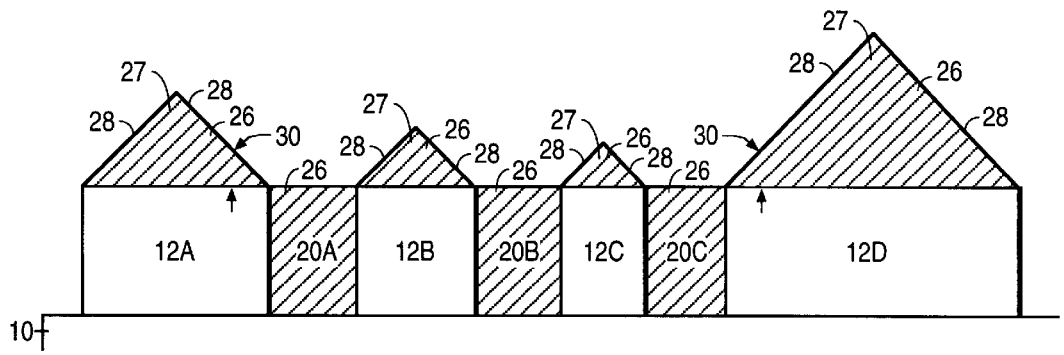
FIG. 2 is a view similar to FIG. 1 after a first amount of a first material is deposited on the substrate.
Figure 3:
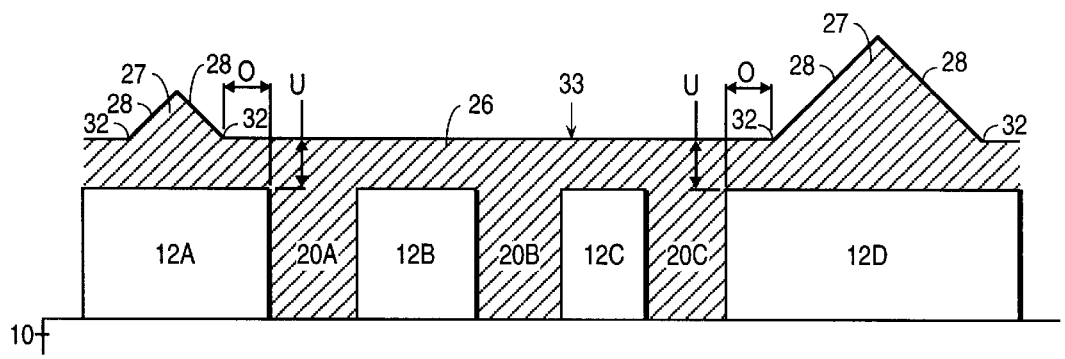
FIG. 3 is a view similar to FIG. 2 after a second amount of the first material is deposited on the substrate.

FIGS. 2 and 3 represent the formation of a first layer on the substrate.

FIG. 2 illustrates the structure of FIG. 1 after a first amount of a first material 26 is deposited thereon, covering the members 12 and filling the gaps 20. In one embodiment the first material is deposited by means of a high density plasma deposition technique. High density plasma deposition is, in some instances, preferred because of its high gap fill characteristics, especially for gaps having high aspect ratios. High density plasma deposition is also characterized in that, when utilized results in the formation of a "hill" on higher lying areas. As such, FIG. 2 illustrates the formation of such a hill 27, which is formed by such a high density plasma deposition process, on each of the members 12. The hill 27 has an inclined surface 28 extending from an edge of the member 12 over the member 12. The inclined surface 28 typically has an angle 30, relatively to a top surface of the member, of about 45°.

The first material is a dielectric chosen to have a relatively low dielectric constant K, typically below 4. Materials with relatively low dielectric constants include $SiO_2$ (dielectric constant of 4), silicon dioxide doped with fluorine, and SiOF (dielectric constant of 3.5). It is to be appreciated that another material may also be used having a low dielectric constant. For example, one of skill in the art will appreciate that first material may be an organic material. Such organic materials may be, for example, a poly aryl ether or a paralene.

High density plasma deposition is a process that is known to persons skilled in the art and is not discussed in detail herein. Typical high density plasma deposition parameters include microwave power of between 500W and 600W, a wafer temperature of between 350° C. and 400° C. A gas ratio of $SiF_4$: $O_2$ of 2.5:1 is typically used for purposes of forming SiOF. Argon or nitrogen may be used for purposes of ion bombardment. Persons skilled in the art will appreciate that the way of the introduction of silane will modulate the way that Fluorine bonds thus increasing a stable fluorine, and therefore SiOF deposition. Persons skilled in the art would also appreciate that fluorine may be obtained from certain Fluoro-carbon species.

A substance may also be introduced into the first material which causes a reduction in the dielectric constant of the first material. For example, $SiO_2$ may be deposited as the first material, thus having a dielectric constant of 4. Fluorine may then be doped into the $SiO_2$ to create SiOF with a dielectric constant of about 3.5. The dopant may for example be introduced into the first material during an ion implantation technique which may be a $CF_4CHF_3$ or an $NF_3$ or other ion implantation technique which is known in the art.

FIG. 3 illustrates the structure of FIG. 2 after a second amount of the first material 26 is deposited thereon. Due to the characteristics of the high density plasma deposition technique utilized in depositing the first material 26, the positioning of the inclined surface 28 remains substantially unchanged as the second amount of the first material is deposited. The second amount of the first material 26 is deposited next to the inclined surface 28 so that a foot 32 of the inclined surface moves along the inclined surface, thus upwardly by a distance U, and over by a distance O, of a respective member 12. The metal lines 12b and 12c are much narrower than the guard ring 12a and the bond pad 12d so that the hill 27 on each of the metal lines 12b and 12c becomes completely covered, while a portion of the hill 27 on respectively the guard ring 12a and the bond pad 12d remains uncovered.

A first layer 33, of the first material 26, is thus formed on the substrate 10 to cover the members 12 and fill the gaps 20.

Figure 4:
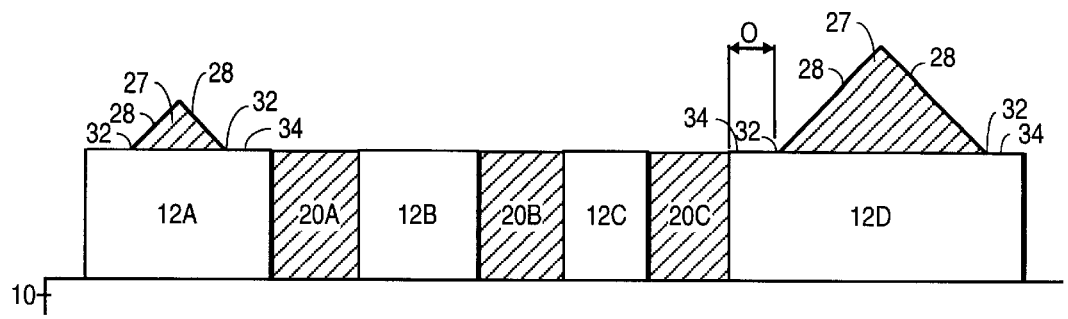
FIG. 4 is a view similar to FIG. 3 after an etching step.
Figure 5:
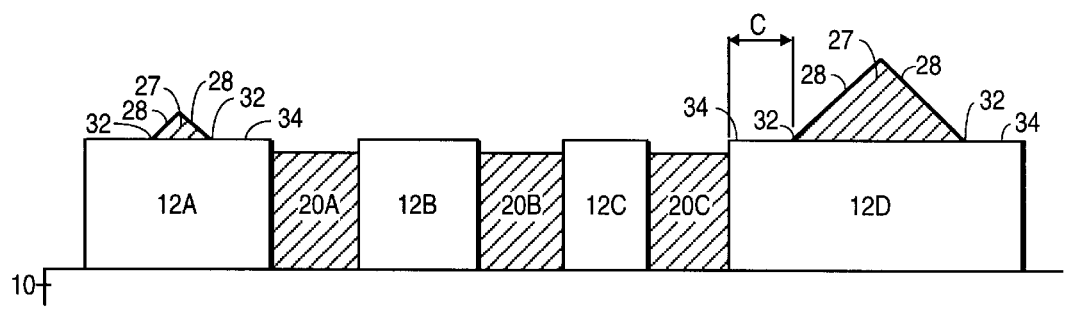
FIG. 5 is a view similar to FIG. 4 after further etching.

FIGS. 4 and 5 represent etch back of the first layer.

FIG. 4 illustrates the structure of FIG. 3 after initial exposure to an etch environment. The etching results in an upper surface of the first layer 33 to drop, causing the metal lines 12b and 12c to be cleared, and the foot 32 of each of the inclined surfaces 28 over the guard ring 12a and the bond pad 12d to drop substantially vertically onto an upper surface of the guard ring 12a and the bond pad 12d, respectively. A region 34, with a width equal to the dimension O of FIG. 3, is so cleared adjacent edges of the guard ring 12d and the bond pad 12d, respectively.

The first layer 33 may be etched utilizing an isotropic etch or a anisotropic etch. An anisotropic etch more directly attacks the surfaces 28 and may cause the surfaces 28 to recede faster than an isotropic etch. One skilled in the art would appreciate that any etchant such as $CF_4$, $CHF_3$, $NF_3$, $SF_6$ or $CF_6$ may be used. Plasma or non-plasma etching techniques may be utilized.

Further etching of the first material, as illustrated in FIG. 5, causes the width of the region 34 to increase to a width C, and some of the first material within the gaps 12 to be removed to a depth D.

It should be noted that the width C of the region 34 is primarily dependent on the distance 0 that the foot 32 of the inclined surface 28 moves over. A larger deposit of the first material will therefore result in a larger width C. A very thick first layer 33 will thus result in a wider cleared region C. A very thick first layer is, however, undesirable from the point of view that it requires more etch back, resulting in greater cost of both the first material and etchant, and reduces throughput. There is thus a trade off between the width C, being a function of the amount of deposition of the region 34, and practicality of etch back.

It should also be noted, secondly, that width C of the region 34 is a function of the amount of etch back. The more the etch back is, the wider the width C will become. However, the depth D is also dependent on the amount of etch back. In order to maintain a enough low dielectric material within the gaps 20, it is however required to keep the depth D to a minimum. There is thus also a trade off between the width C, being a function of etch back, and maintaining as much of the first material in the gaps 20.

In a preferred embodiment, the width C is above 0.5 micron, but, for the stated reasons of practicality, is below 0.7 micron, and the depth D is no more than 0.25 micron.

Figure 6:
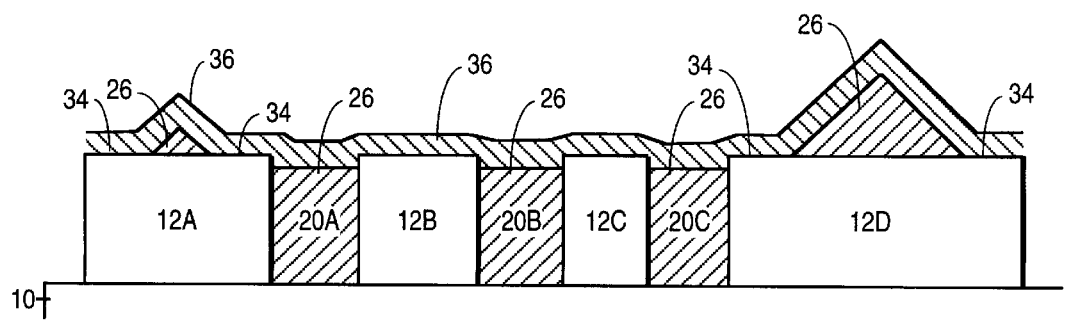
FIG. 6 is a view similar to FIG. 5 after a second material is deposited on the substrate.

FIG. 6 illustrates the structure of FIG. 5 after a second layer 36, of a second material, is deposited over the members 12 and the first material 26 remaining within the gaps 20 and on the guard ring 12a and the bond pad 12d. The second layer thus seals on the regions 34 of the guard ring 12a and the bond pad 12d. The second material is chosen to be resistant to moisture. The second material can be any material providing a hermetic seal and is typically a nitride. Such sealing layers typically have relatively high dielectric constants, typically above 7. $Si_3N_4$, for example, has a dielectric constant of between 7 and 10. The second material is however kept out of the gaps 20 by means of the first material having a relatively low dielectric constant.

$Si_3N_4$ may be deposited by means of a silane and $NH_3$ mixture, a silane and $N_2O$ mixture, or another mixture which is known to persons skilled in the art, and utilizing known processes such as chemical vapor deposition or high density plasma deposition.

By forming the first material, with a relatively a low dielectric constant, within the gaps 20, resistance-capacitance (RC) delay can be minimized with the added benefit that the gaps 20 are individually sealed, by the second material, against the ingress of moisture. The effectiveness of the seal is dependent on the width C of the region 34 and, as previously stated, the width C is preferably above 0.5 micron in order to ensure a proper seal. The thickness of the second layer 36 is typically in the order of about 0.2 micron.

A scratch resistant layer may then be formed on the second, moisture resistant layer 36. The scratch resistant layer may be a polyimide material or the like.

Figure 7:
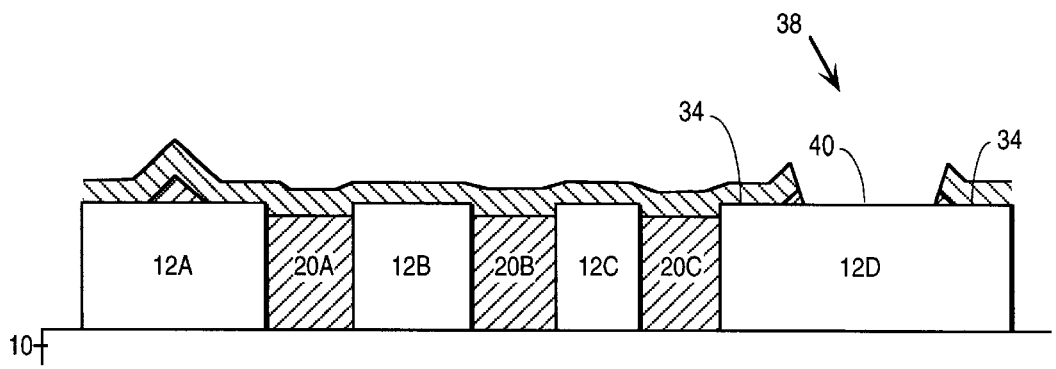
FIG. 7 is a view similar to FIG. 6 after an opening is formed in the second material.

As illustrated in FIG. 7, an opening can be etched, utilizing known photolithographic techniques, through the scratch resistant layer 37, the second layer 36 and the first material remaining on the bond pad 12d to clear an area 40 on the bond pad 12d. The opening 38 is formed within the region 34 so that any moisture entering the opening 38 is prevented from flowing into the gap 20c by the second layer 36 sealing on the region 34 about the opening 38.

FIG. 7 thus illustrates a semiconductor chip, according to the invention, which includes a substrate 10, a bond pad 12d and a metal line 12c on the substrate, a first material 33, with a first dielectric constant, within a gap 20c between the bond pad 12d and the metal line 12c, and a layer 36 formed over the first material 33 and sealing on a region 34 on the bond pad 12d. The layer is of a second material which is resistant to moisture and which has a second dielectric constant which is greater than the first dielectric constant, and has an opening 38 formed therein, clearing an area 40 of the bond pad 12d within the sealing region 34.

Figure 8:
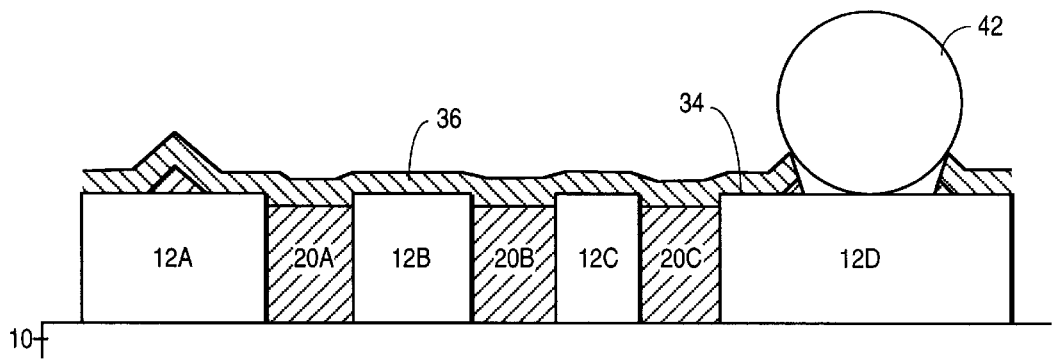
FIG. 8 is a view similar to FIG. 7 after a C4 solder ball is formed in the opening.

A conductor may then be attached to the area 40 on the bond pad 12d and lead out of the opening 38 for purposes of connecting the bond pad 12d electrically to another device. FIG. 8, for example, illustrates the structure of FIG. 7 after the formation of a controlled collapse chip connect (C4) solder ball 42 in the opening 38. One skilled in the art would appreciate that FIG. 9 illustrates a solder bumped flip chip (FC). One skilled in the art would also appreciate that any other conductor may be attached to the bond pad, utilizing known techniques such as wirebonding, tape automated bonding (TAB), or micron bump bonding (MBB).

Thus, a semiconductor chip and method of sealing a semiconductor substrate have been described. Although the present invention has been described with reference to specific exemplary embodiments, it will be evident that various modifications and changes may be made to these embodiments without departing from the broader scope and spirit of the invention. Accordingly, the specification and drawings are to be regarded in an illustrative rather than a restrictive sense.

What is claimed:

1. A method of sealing a substrate, comprising:

depositing a first amount of a first material, having a first dielectric constant, on the substrate to cover a bond pad and a metal line on the substrate and fill a gap between the metal line and the bond pad, the first amount of material forming an inclined surface extending from an edge of the bond pad over the bond pad;

depositing a second amount of the first material next to the inclined surface to cause a foot of the inclined surface to move along the inclined surface;

etching the first material to cause the foot of the inclined surface to drop onto the bond pad, thereby clearing a region of the bond pad adjacent the foot of the inclined surface;

forming a layer on the first material and sealing on the cleared region of the bond pad, the layer being of a second material which is resistant to moisture and has a second dielectric constant which is greater than the first dielectric constant; and etching the second layer and the first material to clear an area of the bond pad within the sealing region.

2. The method of claim 1 wherein the first dielectric constant is less than 4.

3. The method of claim 1 wherein the first material is selected from the group consisting of: SiOF; $SiO_2$.

4. The method of claim 1 wherein the gap has an aspect ratio of at least 2.

5. The method of claim 1 wherein the gap is less than 0.85 μm in width.

6. The method of claim 1 wherein the deposition of the second amount of material causes the foot of the inclined surface to move over the bond pad by a distance of at least 0.4 μm.

7. The method of claim 1 wherein the inclined surface is at approximately 45° to the bond pad.

8. The method of claim 1 wherein the second material is a nitride.

9. The method of claim 8 wherein the second material is $Si_3N_4$.

10. The method of claim 1 wherein the first material is etched with an isotropic etch.

11. The method of claim 1 wherein the first material is etched with an anisotropic etch.

12. The method of claim 1 which includes the step of introducing a substance into the first material, causing a reduction in the dielectric constant of the first material.

13. The method of claim 12 wherein the first material is $SiO_2$ and the substance includes Fluorine.

14. The method of claim 12 wherein the substance is introduced into the first material during an ion implantation technique.

15. A method of sealing a substrate, comprising: depositing a first amount of a first material, having a first dielectric constant, on the substrate to cover a first conductor and a second conductor on the substrate and fill a gap between the second conductor and the first conductor, the first amount of material forming an inclined surface extending from an edge of the first conductor over the first conductor;

depositing a second amount of the first material next to the inclined surface to cause a foot of the inclined surface to move along the inclined surface;

etching the first material to cause the foot of the inclined surface to drop onto the first conductor, thereby clearing a region of the first conductor adjacent the foot of the inclined surface;

forming a layer on the first material and sealing on the cleared region of the first conductor, the layer being of a second material which is resistant to moisture and has a second dielectric constant which is greater than the first dielectric constant; and etching the second layer and the first material to clear an area of the first conductor within the sealing region.

16. The method of claim 15 wherein the first dielectric constant is less than 4.

17. The method of claim 15 wherein the first material is selected from the group consisting of: SiOF; $SiO_2$.

18. The method of claim 15 wherein the gap has an aspect ratio of at least 2.

19. The method of claim 15 wherein the gap is less than 0.85 µm in width.

20. The method of claim 15 wherein the deposition of the second amount of material causes the foot of the inclined surface to move over the first conductor by a distance of at least 0.4 µm.

21. The method of claim 15 wherein the inclined surface is at approximately 45° to the first conductor.

22. The method of claim 15 wherein the second material is a nitride.

23. The method of claim 22 wherein the second material is $Si_3N_4$.

24. The method of claim 15 wherein the first material is etched with an isotropic etch.

25. The method of claim 15 wherein the first material is etched with an anisotropic etch.

26. The method of claim 15 which includes the step of introducing a substance into the first material, causing a reduction in the dielectric constant of the first material.

27. The method of claim 26 wherein the first material is $SiO_2$ and the substance includes Fluorine.

28. The method of claim 26 wherein the substance is introduced into the first material during an ion implantation technique.

29. The method of claim 15 wherein the first conductor is a bond pad and the second conductor is a metal line.

30. The method of claim 15 wherein the first conductor is a guard ring and the second conductor is a metal line.

* * * * *